(12) United States Patent
Seino et al.

(10) Patent No.: US 7,300,884 B2
(45) Date of Patent: Nov. 27, 2007

(54) PATTERN FORMING METHOD, UNDERLAYER FILM FORMING COMPOSITION, AND METHOD OF MANUFACTURING SEMICONDUCTOR DEVICE

(75) Inventors: Yuriko Seino, Yokohama (JP); Yasuhiko Sato, Yokkaichi (JP); Yasunobu Onishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 11/270,621

(22) Filed: Nov. 10, 2005

(65) Prior Publication Data

US 2006/0115990 A1 Jun. 1, 2006

(30) Foreign Application Priority Data

Nov. 10, 2004 (JP) ............................. 2004-326768

(51) Int. Cl.
*H01L 21/302* (2006.01)
(52) U.S. Cl. ...................... 438/736; 438/431; 438/710; 430/310
(58) Field of Classification Search ................ 438/486, 438/706, 710, 431, 448, 736; 430/310, 314, 430/3
See application file for complete search history.

(56) References Cited

U.S. PATENT DOCUMENTS

| 4,701,423 | A | * | 10/1987 | Szluk ........................ 438/231 |
| 6,420,271 | B2 | | 7/2002 | Sato et al. |
| 6,566,180 | B2 | * | 5/2003 | Park et al. ................. 438/166 |
| 6,576,562 | B2 | | 6/2003 | Ohuchi et al. |
| 6,853,520 | B2 | * | 2/2005 | Fukuzawa et al. ....... 360/324.1 |
| 2004/0224512 | A1 | | 11/2004 | Sato et al. |

FOREIGN PATENT DOCUMENTS

JP 2002-198295 7/2002

* cited by examiner

*Primary Examiner*—Lan Vinh
(74) *Attorney, Agent, or Firm*—Finnegan, Henderson, Farabow, Garrett & Dunner, L.L.P.

(57) ABSTRACT

According to an aspect of the invention, there is provided a pattern forming method comprising forming an underlayer film on a film to be worked which has been formed on a semiconductor substrate, subjecting the underlayer film to an oxidizing treatment, forming an intermediate film which becomes a mask of the underlayer film, forming a resist film on the intermediate film, exposing the resist film to light to form a resist pattern, transferring the resist pattern onto the intermediate film to form an intermediate film pattern, and transferring the intermediate film pattern onto the underlayer film to form an underlayer film pattern.

16 Claims, 3 Drawing Sheets

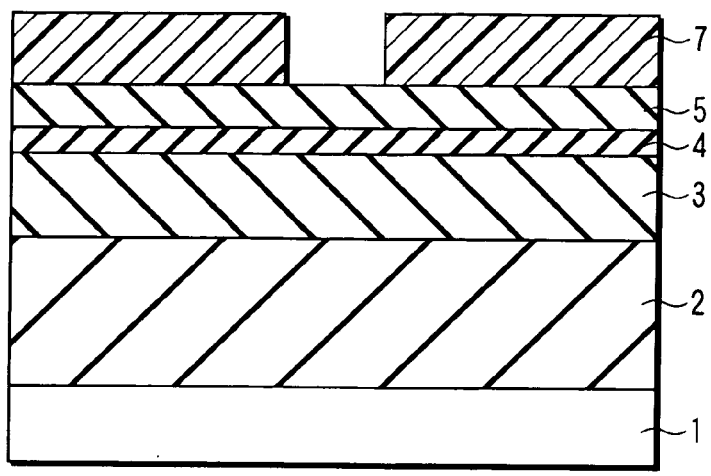
F I G. 4
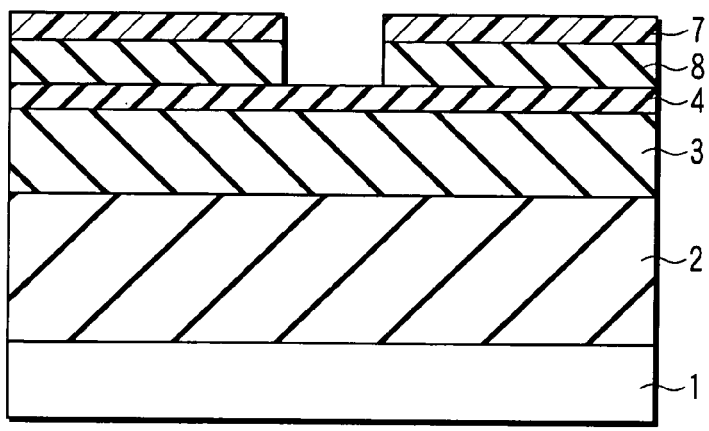
F I G. 5
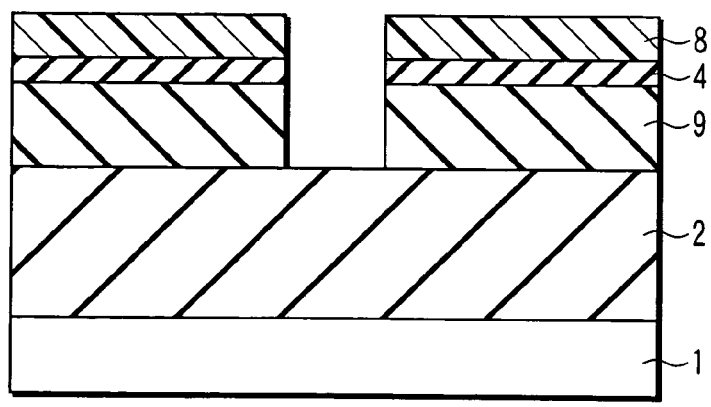
F I G. 6

PATTERN FORMING METHOD, UNDERLAYER FILM FORMING COMPOSITION, AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-326768, filed Nov. 10, 2004, the entire contents of which are incorporated herein by reference.

BACKGROUND OF THE INVENTION

1. Field of the Invention

The present invention relates to a lithography process in manufacturing a semiconductor device, more particularly to a pattern forming method in a multilayered resist process, an underlayer film forming composition, and a method of manufacturing a semiconductor device.

2. Description of the Related Art

In recent years, accompanying miniaturization of a semiconductor device, a multilayered resist pattern forming method has been performed in order to cope with a reduced resist film thickness and a lacking mask resistance. In the multilayered resist pattern forming method, a film constituted of three layers of an underlayer film/an intermediate film/a resist film is formed on a film to be worked formed on a wafer substrate, and a resist pattern is successively transferred to an intermediate layer/the underlayer film/the film to be worked.

In this method, first the underlayer film is formed which is an anti-reflection film to absorb an underlayer stepped portion sufficiently, an intermediate layer such as spin on glass (SOG) having the mask resistance is formed on the underlayer film, and the resist film is further formed on the intermediate layer.

Next, the resist film is patterned by photolithography, and the pattern is transferred onto the intermediate film by etching using the patterned resist film as a mask. Furthermore, the pattern is transferred onto the underlayer film by the etching using the patterned intermediate film as the mask, and finally the film to be worked is worked by use of this underlayer film as the mask.

In this method, since cracks are generated in the underlayer film after applying a solution during formation of the underlayer film, in general, a crosslinking agent is added to an underlayer film forming composition. Examples of the crosslinking agent include multinuclear phenol, and various commercially available hardeners such as an epoxy compound, a melamine-based hardener, and a glycoluril-based hardener. However, when the crosslinking agent is excessively added, contents of elements such as O, N, and H having high reactivity to the etching increase in polymer, and there is a problem that an etching resistance of the underlayer film deteriorates.

Moreover, in Jpn. Pat. Appln. KOKAI Publication No. 2002-198295, there is disclosed a pattern forming method in which a carbon-containing underlayer film is formed by a multilayered resist process, and the underlayer film is coated with an intermediate film containing a silicon compound including Si—Si bonding as a main chain and having a desorbing property.

BRIEF SUMMARY OF THE INVENTION

According to an aspect of the invention, there is provided a pattern forming method comprising: forming an underlayer film on a film to be worked which has been formed on a semiconductor substrate; subjecting the underlayer film to an oxidizing treatment; forming an intermediate film which becomes a mask of the underlayer film; forming a resist film on the intermediate film; exposing the resist film to light to form a resist pattern; transferring the resist pattern onto the intermediate film to form an intermediate film pattern; and transferring the intermediate film pattern onto the underlayer film to form an underlayer film pattern.

According to another aspect of the invention, there is provided a pattern forming method comprising: forming an underlayer film on a film to be worked which has been formed on a semiconductor substrate; subjecting the underlayer film to an oxidizing treatment; forming a resist film containing an inorganic element on the underlayer film; exposing the resist film to light to form a resist pattern; and transferring the resist pattern onto the underlayer film to form an underlayer film pattern.

According to another aspect of the invention, there is provided an underlayer film forming composition which is a composition forming an underlayer film for a multilayered resist process and which contains an oxidizing agent.

According to another aspect of the invention, there is provided a method of manufacturing a semiconductor device comprising: forming an underlayer film on a film to be worked which has been formed on a semiconductor substrate; subjecting the underlayer film to an oxidizing treatment; forming an intermediate film which becomes a mask of the underlayer film; forming a resist film on the intermediate film; exposing the resist film to light to form a resist pattern; transferring the resist pattern onto the intermediate film to form an intermediate film pattern; and transferring the intermediate film pattern onto the underlayer film to form an underlayer film pattern.

According to another aspect of the invention, there is provided a method of manufacturing a semiconductor device comprising: forming an underlayer film on a film to be worked which has been formed on a semiconductor substrate; subjecting the underlayer film to an oxidizing treatment; forming a resist film containing an inorganic element on the underlayer film; exposing the resist film to light to form a resist pattern; and transferring the resist pattern onto the underlayer film to form an underlayer film pattern.

BRIEF DESCRIPTION OF THE SEVERAL VIEWS OF THE DRAWING

FIG. 4 is a sectional view showing a procedure for the pattern formation as the process of manufacturing the semiconductor device in the first embodiment;

FIG. 5 is a sectional view showing a procedure for the pattern formation as the process of manufacturing the semiconductor device in the first embodiment;

FIG. 6 is a sectional view showing a procedure for the pattern formation as the process of manufacturing the semiconductor device in the first embodiment;

DETAILED DESCRIPTION OF THE INVENTION

In a first embodiment, in a multilayered resist process, an underlayer film is subjected to a heating treatment, exposure to an oxidizing agent, irradiation with an energy beam and the like in an oxygen atmosphere to form an oxidized surface on the underlayer film, so that cracks are prevented from being generated in the underlayer film.

FIGS. 1 to 7 are sectional views showing a procedure for pattern formation as a process of manufacturing a semiconductor device in the first embodiment.

Figure 1:
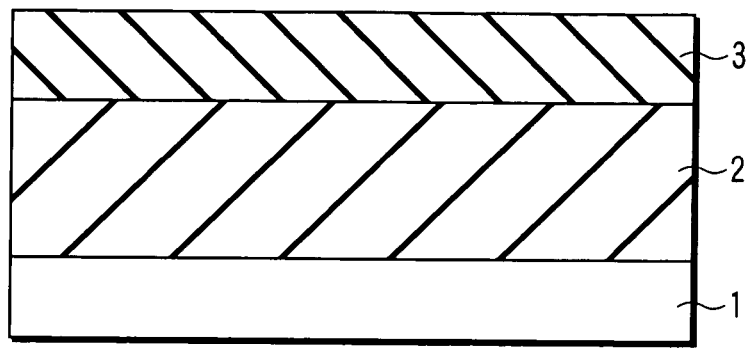
FIG. 1 is a sectional view showing a procedure for pattern formation as a process of manufacturing a semiconductor device in a first embodiment.

First, as shown in FIG. 1, an underlayer film 3 is formed on a film 2 to be worked such as an insulating film formed on a wafer substrate (silicon substrate, semiconductor substrate) 1 in which an element (MOS transistor) including a diffusion layer (not shown) is formed.

A material of the underlayer film 3 is not especially limited, but examples of the material include carbon containing compounds (polymer compound) such as an acenaphthylene-based compound, a polyarylene-based compound, a phenol-based compound, and a novolak-based compound. The material is dissolved in an organic solvent to prepare an underlayer film solution. A molecular weight of the compound is preferably 200 to 100,000. This is because when the weight is less than 200, the compound is dissolved in the solvent. When the weight exceeds 100,000, it is difficult to prepare the solution. A carbon content of the underlayer film 3 after heated is preferably 80 wt % or more. This is because when the content is less than 80 wt %, a sufficient etching resistance is not obtained.

A film thickness of the underlayer film 3 is preferably 20 to 5000 nm. When the thickness is less than 20 nm, the resistance to etching of the film 2 to be worked as the mask is insufficient. When the thickness exceeds 5000 nm, a dimension conversion difference becomes remarkable during the transferring of a resist pattern, and it becomes difficult to form a micro pattern.

A composition of the underlayer film 3 is not especially limited to one type, and several types of compounds may be mixed. If necessary, additives may be added such as the following crosslinking agent, binder resin, radiation absorber, surfactant, acid generator, defoamer, storage stabilizer, and adhesive assistant.

Examples of the crosslinking agent include, as crack preventing agents after the coating, multinuclear phenol, glycoluril-based hardener, epoxy compound, and melamine-based hardener. Examples of the binder resin include thermosetting resins such as an acrylic resin, a phenol resin, and an urea resin, and thermoplastic resins such as polyethylene and polypropylene. Examples of the radiation absorber which absorbs light reflected from the film 2 to be worked include dye, polybenzimidazole, polysulfone and the like. Additionally, examples of the additive include the surfactant for improving a coating property, striation, wettability, and developing property, and acid generators such as a photo acid generator and a thermal acid generator.

The film 2 to be worked formed on the wafer substrate 1 is coated with the underlayer film solution by a spin coating process, and the coated film is heated to form the underlayer film 3.

In the first embodiment, as a method of forming a coated film such as the underlayer film or the intermediate film, a rotary coating process is used in which all processes are simple at a low cost, but another flow cast coating, roll coating, CVD process or the like may be used. A heating temperature is in a temperature range of generally about 90 to 500° C., preferably 150 to 400° C. required for hardening the underlayer film.

Figure 2:
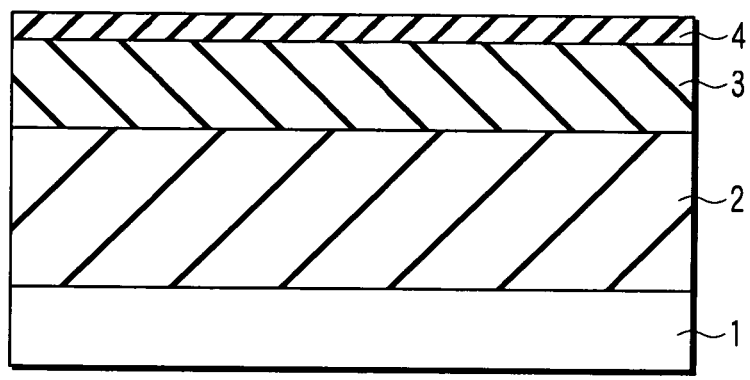
FIG. 2 is a sectional view showing a procedure for the pattern formation as the process of manufacturing the semiconductor device in the first embodiment.

Here, the underlayer film is heated not in usual atmospheric air but in an oxygen atmosphere in which an oxygen concentration is not less than that in atmospheric air. Accordingly, the underlayer film 3 is oxidized to form a surface area 4 on the underlayer film 3 as shown in FIG. 2. A method of forming the surface area 4 may be a method in which an oxidizing treatment is performed after forming the underlayer film 3. The underlayer film 3 can be exposed to an oxidizing agent such as ozone or hydrogen peroxide. The oxidizing treatment may be performed in a method of directly irradiating the underlayer film 3 with an energy beam, or a method of immersing the underlayer film 3 into water, a hydrogen peroxide solution or the like to irradiate the film with the energy beam.

The energy beam is not especially limited, but light having a wavelength of 700 nm or less, an X-ray, and an electron beam are preferable. When the wavelength exceeds 700 nm, energy is weak, and it is difficult to oxidize the surface of the underlayer film 3. Examples of an exposure amount include 1 to 1000 mJ/cm$^2$ on conditions that the energy sufficient for oxidization is obtained and throughput is prevented from being lowered. For a similar reason, an irradiation amount of the electron beam is appropriately 0.1 µC/cm$^2$ to 1000 C/cm$^2$.

Figure 3:
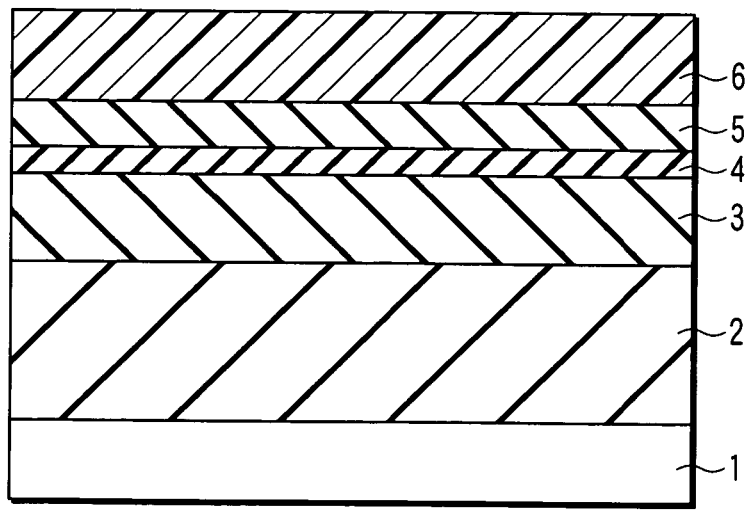
FIG. 3 is a sectional view showing a procedure for the pattern formation as the process of manufacturing the semiconductor device in the first embodiment.

Next, as shown in FIG. 3, an intermediate film 5 is formed as a mask of the underlayer film 3 on the oxidized surface area 4 of the underlayer film 3, and a resist film 6 is formed on the intermediate film 5. A film thickness of the intermediate film 5 is preferably 10 to 1000 nm in respect of the mask resistance and working limit. A material of the intermediate film 5 may be inorganic oxide such as silicon oxide, aluminum oxide, titanium oxide, or tungsten oxide which is a component nonvolatile to oxygen plasma for use in etching the underlayer film 3.

The oxidized surface area 4 of the underlayer film 3 is coated with this SOG composition by the spin coating process, and the coated film is heated to form the intermediate film 5. A heating temperature is in a temperature range of generally about 90 to 500° C., preferably 200 to 450° C. required for hardening the intermediate film 5.

Next, after coating the intermediate film 5 with a resist solution, the coated film is heated to form the resist film 6. The resist is not especially limited, and examples of the resist include a positive or negative chemically amplified type resist containing the photo acid generator. A resist film thickness is preferably 10 to 10,000 nm. This is because in a case where the mask resistance is sufficient, when the film is thinner, an exposure amount allowance at an exposure time, a focus allowance, and resolution can be improved.

Next, as shown in FIG. 4, for example, after exposing the resist film 6 to KrF or ArF excimer laser, an alkali developing treatment is performed to form a resist pattern 7.

Figure 7:
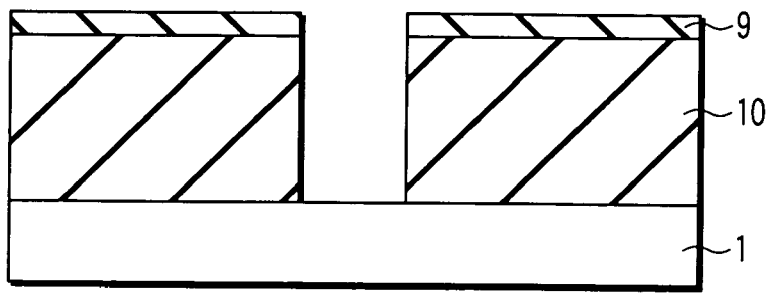
FIG. 7 is a sectional view showing a procedure for the pattern formation as the process of manufacturing the semiconductor device in the first embodiment.

Exposure light is not especially limited, and examples of the light include ultraviolet light, X-ray, electron beam, ion beam and the like. Furthermore, as shown in FIG. 5, the resist pattern 7 is transferred onto the intermediate film 5 by use of a dry etching process to form an intermediate film pattern 8. Similarly as shown in FIG. 6, the intermediate film pattern 8 is transferred onto the underlayer film 3 to form an underlayer film pattern 9. Moreover, as shown in FIG. 7, a pattern 10 of the film to be worked is formed using the underlayer film pattern 9 as the mask.

As described above, the first embodiment is the pattern forming method using three layers of the underlayer film 3, the intermediate film 5, and the resist film 6. Even in a pattern forming method using two layers of the underlayer film 3 and the resist film 6, the underlayer film 3 is oxidized in a similar method, and can be provided with a crack resistance. In this case, since a material of the resist film 6 constitutes a mask material of the underlayer film 3, examples of the material include a resist containing an inorganic element such as silicon, aluminum, titanium, tungsten, or germanium.

According to the first embodiment, since the surface of the underlayer film 3 is oxidized, a content of O element increases in a surface portion of the underlayer film 3, crosslinking of the underlayer film 3 is promoted, elasticity of the underlayer film 3 rises, and cracks are not easily generated.

In a second embodiment, in the multilayered resist process described in the first embodiment, a radical generator is added as an oxidizing agent to a composition forming an underlayer film, crosslinking of the whole film is uniformly promoted to thereby raise the elasticity of the film, and cracks are prevented.

According to the second embodiment, an underlayer film forming composition contains the oxidizing agent as an additive in addition to the composition described in the first embodiment. The oxidizing agent is not especially limited as long as a crack resistance can be enhanced as compared with a conventional underlayer film forming composition. Examples of a general radical generator include azo compound, peroxide, alkyl aryl ketone, silyl peroxide, organic halogen compound and the like.

A heating temperature of the underlayer film 3 needs to be selected in consideration of a decomposition temperature of the radical generator. At a high heating temperature of 100° C. or more, there is used a radical generator such as cumene hydroperoxide, tert-butylhydroperoxide, or di-tert-butylhydroperoxide. At a medium heating temperature which is less than 100° C., there is used a radical generator such as benzoyl peroxide, azobisisobutyronitrile, or acetyl peroxide.

According to the second embodiment, when an oxidizing agent as the radical generator is added to the underlayer film forming composition, the whole underlayer film 3 is uniformly oxidized, a content of O element increases, crosslinking of the underlayer film 3 is promoted, elasticity of the underlayer film 3 rises, and a crack resistance can be imparted.

In a third embodiment, when cracks are generated in an underlayer film in a multilayered resist process, the underlayer film is coated again with an underlayer film composition to bury the composition in the cracks.

Figure 8:
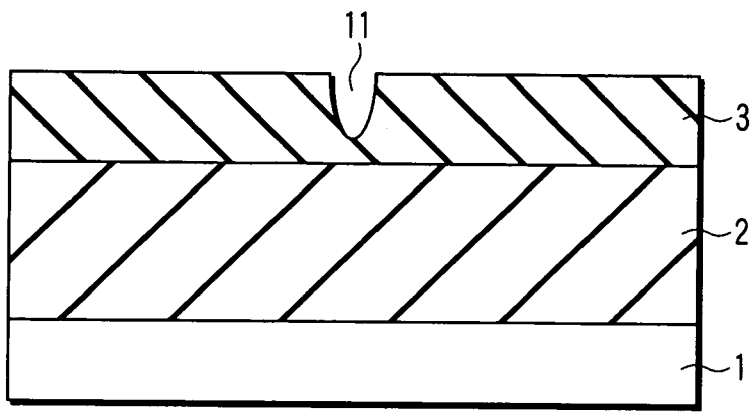
FIG. 8 is a sectional view showing a procedure for the pattern formation as the process of manufacturing the semiconductor device in a third embodiment.
Figure 9:
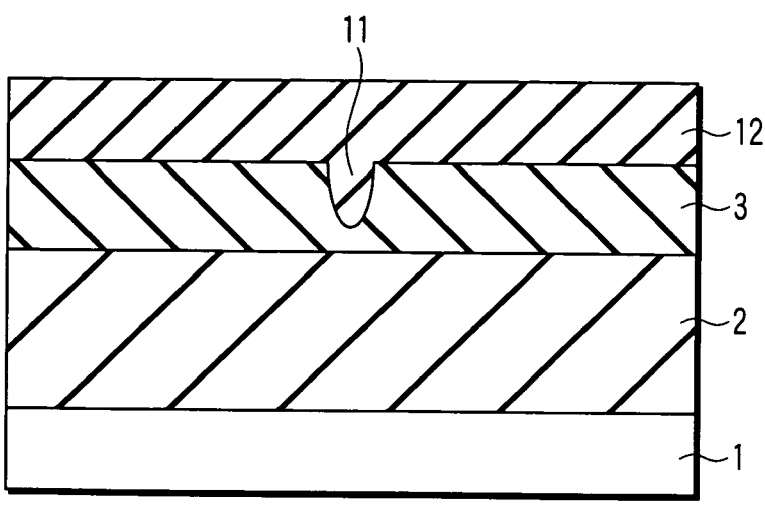
FIG. 9 is a sectional view showing a procedure for the pattern formation as the process of manufacturing the semiconductor device in the third embodiment.

FIGS. 8 and 9 are sectional views showing a treatment procedure for pattern formation as a process of manufacturing a semiconductor device in the third embodiment. In FIGS. 8 and 9, the same part as that of FIG. 1 is denoted with the same reference numerals. There will be described a case where a crack 11 is generated in an underlayer film 3 as shown in FIG. 8 after forming the underlayer film 3 on a film 2 to be worked formed on a wafer substrate 1 as shown in FIG. 1.

The underlayer film 3 in which the crack 11 is generated is coated with an underlayer film composition containing an oxidizing agent described in the second embodiment as shown in FIG. 9. Thereafter, the film is heated, and the underlayer film composition is buried in the crack 11 of the underlayer film 3 to form a second underlayer film 12. As a composition of the second underlayer film 12, the same underlayer film composition as that of the first underlayer film 3 may be used again to fill in the crack 11. In subsequent steps, a pattern is formed in the same manner as in FIGS. 3 to 7 of the first embodiment.

Moreover, the third embodiment is the pattern forming method using three layers of the underlayer film 3, an intermediate film 5, and a resist film 6 in the same manner as in the first embodiment. Even in a pattern forming method using two layers of the underlayer film 3 and the resist film 6, the underlayer film 3 can be coated with the underlayer film composition to fill in the crack in the same method. In this case, since a material of the resist film 6 constitutes a mask material of the underlayer film 3, examples of the material is a resist containing an inorganic element such as silicon, aluminum, titanium, tungsten, or germanium.

According to the third embodiment, the underlayer film composition is buried in the underlayer film 3 in which the crack is generated, so that the crack can be eliminated.

According to the present embodiments, there can be provided a pattern forming method, an underlayer film forming composition, and a method of manufacturing a semiconductor device, in which an underlayer film for a multilayered resist process is provided with a crack resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A pattern forming method comprising:
   forming an organic underlayer film on a film to be worked which has been formed on a semiconductor substrate;
   subjecting the organic underlayer film to an oxidizing treatment;
   forming an intermediate film which becomes a mask of the organic underlayer film;
   forming a resist film on the intermediate film;
   exposing the resist film to light to form a resist pattern;
   transferring the resist pattern onto the intermediate film to form an intermediate film pattern; and
   transferring the intermediate film pattern onto the organic underlayer film to form an underlayer film pattern.

2. The pattern forming method according to claim 1, wherein the organic underlayer film is made of a polymer material having a carbon content of 80 wt % or more.

3. The pattern forming method according to claim 1, wherein the oxidizing treatment of the organic underlayer film is a heating treatment performed in an oxygen atmosphere having an oxygen concentration which is not less than that in atmospheric air.

4. The pattern forming method according to claim 1, wherein the oxidizing treatment of the organic underlayer film is a treatment of exposing the organic underlayer film to an oxidizing agent.

5. The pattern forming method according to claim 1, wherein the oxidizing treatment of the organic underlayer film is a treatment of irradiating the organic underlayer film directly with an energy beam.

6. The pattern forming method according to claim 1, wherein the oxidizing treatment of the organic underlayer film is a treatment of immersing the organic underlayer film into a liquid and irradiating the organic underlayer film with an energy beam.

7. The pattern forming method according to claim 1, further comprising:
burying an underlayer film forming composition containing an oxidizing agent or the same underlayer film forming composition as that of the organic underlayer film in a crack of the organic underlayer film to form a second organic underlayer film, in a case where the crack is generated in the organic underlayer film.

8. A pattern forming method comprising:
forming an organic underlayer film on a film to be worked which has been formed on a semiconductor substrate;
subjecting the organic underlayer film to an oxidizing treatment;
forming a resist film containing an inorganic element on the organic underlayer film;
exposing the resist film to light to form a resist pattern; and
transferring the resist pattern onto the organic underlayer film to form an underlayer film pattern.

9. The pattern forming method according to claim 8, wherein the organic underlayer film is made of a polymer material having a carbon content of 80 wt % or more.

10. The pattern forming method according to claim 8, wherein the oxidizing treatment of the organic underlayer film is a heating treatment performed in an oxygen atmosphere having an oxygen concentration which is not less than that in atmospheric air.

11. The pattern forming method according to claim 8, wherein the oxidizing treatment of the organic underlayer film is a treatment of exposing the organic underlayer film to an oxidizing agent.

12. The pattern forming method according to claim 8, wherein the oxidizing treatment of the organic underlayer film is a treatment of irradiating the organic underlayer film directly with an energy beam.

13. The pattern forming method according to claim 8, wherein the oxidizing treatment of the organic underlayer film is a treatment of immersing the organic underlayer film into a liquid and irradiating the organic underlayer film with an energy beam.

14. The pattern forming method according to claim 8, further comprising:
burying an underlayer film forming composition containing an oxidizing agent or the same underlayer film forming composition as that of the organic underlayer film in a crack of the organic underlayer film to form a second organic underlayer film, in a case where the crack is generated in the organic underlayer film.

15. A method of manufacturing a semiconductor device comprising:
forming an organic underlayer film on a film to be worked which has been formed on a semiconductor substrate;
subjecting the organic underlayer film to an oxidizing treatment;
forming an intermediate film which becomes a mask of the organic underlayer film;
forming a resist film on the intermediate film;
exposing the resist film to light to form a resist pattern;
transferring the resist pattern onto the intermediate film to form an intermediate film pattern;
transferring the intermediate film pattern onto the organic underlayer film to form an underlayer film pattern; and
forming a pattern of the film to be worked using the underlayer film pattern as a mask.

16. A method of manufacturing a semiconductor device comprising:
forming an organic underlayer film on a film to be worked which has been formed on a semiconductor substrate;
subjecting the organic underlayer film to an oxidizing treatment;
forming a resist film containing an inorganic element on the organic underlayer film;
exposing the resist film to light to form a resist pattern;
transferring the resist pattern onto the organic underlayer film to form an underlayer film; and
forming a pattern of the film to be worked using the underlayer film pattern as a mask.

* * * * *